(12) United States Patent
Cho et al.

(10) Patent No.: US 6,984,895 B2
(45) Date of Patent: Jan. 10, 2006

(54) BONDING PAD STRUCTURE OF A SEMICONDUCTOR DEVICE

(75) Inventors: Tai-Heui Cho, Suwon (KR); Hyuck-Jin Kang, Seoul (KR); Min-Chul Kim, Suwon (KR); Byung-Yoon Kim, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/125,598

(22) Filed: Apr. 19, 2002

(65) Prior Publication Data
US 2003/0094634 A1 May 22, 2003

(30) Foreign Application Priority Data
Nov. 19, 2001 (KR) ................. 10-2001-0071828

(51) Int. Cl.
H01L 23/48 (2006.01)
H01L 23/52 (2006.01)
H01L 29/40 (2006.01)

(52) U.S. Cl. ..................................................... 257/781
(58) Field of Classification Search ................. 257/781
See application file for complete search history.

(56) References Cited

U.S. PATENT DOCUMENTS

| | | | |
|---|---|---|---|
| 4,495,222 A | 1/1985 | Anderson et al. | 427/89 |
| 5,248,903 A | 9/1993 | Heim | 257/748 |
| 5,309,025 A | 5/1994 | Bryant et al. | |
| 5,357,136 A | 10/1994 | Yoshioka | |
| 5,386,382 A * | 1/1995 | Ahn | 365/174 |
| 5,502,337 A | 3/1996 | Nozaki | 257/773 |
| 5,707,894 A | 1/1998 | Hsiao | |
| 5,736,791 A * | 4/1998 | Fujiki et al. | 257/781 |
| 5,813,664 A | 9/1998 | Pan | 257/303 |
| 5,923,088 A * | 7/1999 | Shiue et al. | 257/758 |
| 6,037,668 A | 3/2000 | Cave et al. | |
| 6,163,074 A | 12/2000 | Lee et al. | 257/734 |
| 6,232,662 B1 * | 5/2001 | Saran | 257/750 |
| 6,300,688 B1 * | 10/2001 | Wong | 257/786 |
| 6,344,410 B1 | 2/2002 | Lopatin et al. | |
| 2001/0010407 A1 | 8/2001 | Ker et al. | |

* cited by examiner

Primary Examiner—Howard Weiss
(74) Attorney, Agent, or Firm—Lee & Morse, P.C.

(57) ABSTRACT

A bonding pad structure in an integrated circuit (IC) and a method for manufacturing thereof comprises a plurality of dummy patterns deposited in sub-layers of the IC, each dummy pattern being connected via a metal link to a plurality of complementary top surface bonding pads, wherein the dummy patterns and the metal link are constructed during the same process steps used to construct the circuit elements included in the IC, without additional or special process steps. Such an imbedded and anchored bonding pad provides contact reliability for both conductive and non-conductive pads used for the interconnection of integrated circuits in a manner that resists layer separation or de-lamination under pulling stresses that are present on the bonding pads.

7 Claims, 23 Drawing Sheets

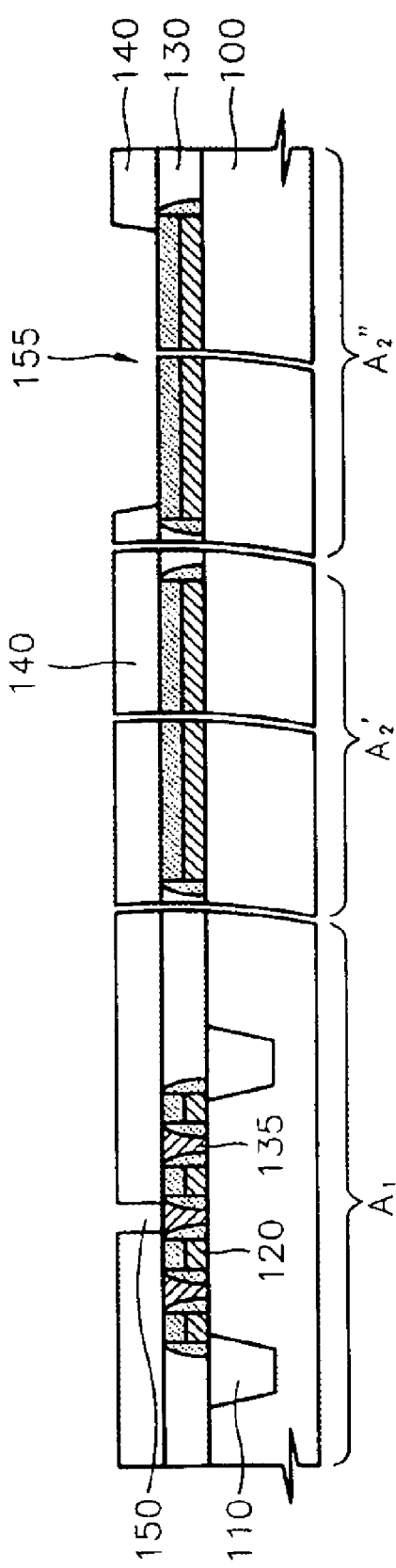

BONDING PAD STRUCTURE OF A SEMICONDUCTOR DEVICE

BACKGROUND OF THE INVENTION

1. Field of the Invention

The present invention relates to the manufacture of semiconductor devices and, more particularly, to a structure directed to and a method for creating a de-lamination resistant interconnection bonding pad in a semiconductor device.

2. Description of the Related Art

A bonding pad connects an integrated circuit on a chip to an integrated circuit outside the chip. FIG. 1 illustrates a cross-sectional view of a conventional semiconductor memory device having a device isolation region 110, a bonding pad 350 for communicating signals externally to the chip, and a DRAM (dynamic random access memory) cell having a stack capacitor and a switching transistor 120. In FIG. 1, A1 represents a memory cell region, and A2 represents a bonding pad region. Reference numeral 120 represents a switching transistor in memory cell region A1, and reference numerals 130, 140, 170 and 280 represent interlayer dielectric layers. Reference numerals 150 and 160 represent a direct contact hole and bit line, respectively. Reference numeral 210 represents a lower electrode of the stack capacitor, and reference numeral 240 represents an upper electrode of the stack capacitor. A capacitor dielectric layer (not shown) is formed between the upper and lower electrodes 210 and 240 of the stack capacitor.

In a conventional bonding pad structure as shown in FIG. 1, an intermetallic dielectric layer 310 is formed between a first aluminum interconnection layer 300 and a second aluminum interconnection layer 330, with a filled contact hole 320 providing the electrical connection between the two aluminum layers. First aluminum interconnection layer 300 is sized such that it underlies intermetallic dielectric layer 310, and when metallically bonded to second aluminum interconnection layer 330 at a later step, provides a structure that mechanically binds the three layers together at the bonding pad location to improve de-lamination characteristics.

As the size of memory device chips decrease, the size of the bonding pads also decrease. Recently, the size of a bonding pad has been reduced from about 100 $\mu$m×100 $\mu$m to 80 $\mu$m×80 $\mu$m or below in accordance with increased integration density of semiconductor memory devices. Accordingly, the contact surface area between first aluminum interconnection layer 300, which constitutes the lower structure of multilayer bonding pad 350, and fourth interlayer dielectric layer 280 decreases, and thus first aluminum interconnection layer 300 may be easily separated from fourth interlayer dielectric layer 280 at the interface therebetween.

One conventional method for overcoming such increased de-lamination characteristics provides for the forming of a polycrystalline silicon (polysilicon) pattern under a bonding pad to prevent the bonding pad from peeling during subsequent manufacturing processes. The use of a polysilicon interface between the metal bond pad and the interlayer dielectric prevents bond pad peeling or lifting by having chemically compatible interlayer surfaces, thereby providing attendant increased adhesive properties. A significant disadvantage, however, is that the polysilicon layer is typically deposited directly over a layer of insulating material rather than over a layer of a metallic material, thereby providing adhesion and anchoring characteristics that are not optimal.

Further, to eliminate the extra process steps of conventional improved bonding pad construction techniques, new techniques for forming a capacitor typically include forming a bottom capacitor plate at the same time as a bottom bonding pad and forming a top capacitor plate at the same time as a top bonding pad, with a single dielectric layer juxtaposed therebetween. While the process step elimination improves the manufacturing throughput of ICs with improved bonding pads by using only three existing deposition layers, the improved manufacturing throughput is at the expense of a more reliable bonding pad structure, specifically structural improvements that can be obtained using embedded and filled via holes discussed above to also provide a depth anchor for added de-lamination resistance.

Various approaches to such interlayer anchoring techniques provide for differing degrees of depth anchoring in addition to the complementary metal/dielectric surfaces. A significant disadvantage of such approaches is that they require many additional fabrication process steps for implementation, rather than fabricating the bonding pad anchoring structure simultaneous with other circuit element processing steps.

SUMMARY OF THE INVENTION

According to embodiments of the present invention, a bonding pad structure in an integrated circuit (IC) and a method for manufacturing thereof preferably comprise a plurality of dummy patterns being deposited in sub-layers of the IC and then being connected via a metal link to a plurality of complementary top surface bonding pads during the same process steps performed to construct the circuit elements of the IC, thereby minimizing or eliminating additional or special process steps required in conventional techniques. Such an imbedded anchoring structure provides improved resistance to layer de-lamination during pulling stresses associated with conventional wire bonding operations and normal mechanical stresses associated with chip-on-chip applications.

The anchoring structure in a semiconductor IC having a plurality of electrical devices and a plurality of deposition layers, preferably comprises a bonding pad having a first interconnection layer and a second interconnection layer integral to each other and at least one peg that vertically traverses at least a portion of one or more intervening deposition layers of the IC. The anchoring structure provides improved bonding between deposition layers as well as improved distribution of physical stress on the bonding pad. The pegs may or may not be electrically conductive, and may or may not be composed of a metal material. When metal is used as the bonding pad material in the embodiments of the present invention, such metal may be preferably selected from a group consisting of tungsten, aluminum, copper and nickel.

The structure may include a bottom surface area of the bonding pad and at least one peg that comprises an area sufficient to: 1) preserve the physical integrity of the semiconductor IC, or 2) prevent de-lamination of the bonding pad from the semiconductor IC. A plurality of pegs may be formed in a mesh type pattern that is integral with the bonding pad.

The structure may further include a metalization layer located beneath the pegs to act as an etch-stop layer to protect underlying layers. The etch stop layer may be an adhesion layer and may be formed from a material selected from the group consisting of metals, metal nitrides, silicides, polysilicon and silicon nitride.

A method for constructing such a bonding pad having an embedded anchoring structure generally comprises the preferable steps of:

1) depositing on a substrate a metallic anchoring layer at a same time and during a same process as a metallic deposition for sub-layer circuit interconnects;
2) overlaying these metal depositions with a dielectric layer at a same time and during a same process as the deposition of a dielectric layer for circuit device elements;
3) etching the dielectric layer to expose the underlying metallic anchoring layer to enable a subsequent metal filling process to create a surface having via holes that are filled to the metallic anchoring layer at a same time and during a same process as interlayer connection holes are etched and filled for circuit device elements;
4) planarizing the metallic anchoring layer down to the dielectric layer;
5) depositing a patterned metallic layer to form a lower surface of the bonding pad at a same time and during a same process as a patterned conductive metal layer is deposited to laterally interconnect circuit device elements;
6) depositing a protective dielectric layer on the assembly;
7) depositing an upper metallization layer at a same time and during a same process as another patterned conductive metal layer is deposited to laterally interconnect circuit device elements; and
8) depositing a passivation layer on the IC, which is then selectively etched to expose bonding pads at a same time and during a same process as the exposing of other desired circuit contacts.

A preferred embodiment of a bonding pad structure in a semiconductor IC having a plurality of electrical devices and a plurality of deposition layers, preferably comprises: a metallic bonding pad having at least a first interconnection layer and a second interconnection layer, which are bonded to each other by a peg vertically traversing at least a portion of one or more intervening deposition layers therebetween, so as to provide improved binding between the plurality of deposition and interconnection layers and thus provide improved distribution of physical stresses on the bonding pad. The metal is preferably electrically conductive, such as tungsten, aluminum, copper and nickel. In a preferred embodiment, a plurality of pegs form a mesh type pattern that is integral with the bonding pad.

An alternative embodiment of such a bonding pad structure may comprise the elements of the preferred embodiment plus an additionally intervening dummy pattern integral with the peg. As in the preferred embodiment, the peg may be electrically conductive and made of metal, such as tungsten, aluminum, copper and nickel. Further, a plurality of such pegs may form a mesh type pattern that is integral with the bonding pad.

A third embodiment of such a bonding pad structure may comprise the elements of the preferred embodiment and a raised dummy pattern integral with the peg, the raised dummy pattern having a height equal to a height of at least one electrical device among a plurality of electrical devices. As in the preferred embodiment, the peg may be electrically conductive and made of metal, such as tungsten, aluminum, copper and nickel. Further, a plurality of such pegs may form a mesh type pattern that is integral with the bonding pad. The raised dummy pattern may comprise an adhesion layer made of a material selected from the group consisting of metals, metal nitrides, silicides, polysilicon and silicon nitride. The electrical device may comprise a capacitor having a height of between about 1 to about 3 microns, and the raised adhesion dummy pattern may comprise at least one capacitor structure.

A preferred method for forming the bonding pad structure of the above embodiment preferably comprises the steps of:

A) forming an etch stop pattern in a bonding pad region of the IC;
B) forming a interlayer dielectric above the etch stop pattern;
C) forming a contact hole in the interlayer dielectric above the etch stop pattern;
D) depositing a conductive material to fill the contact hole;
E) removing the conductive material above the interlayer dielectric;
F) forming a first interconnection layer pattern above the contact hole;
G) depositing an intermetallic dielectric layer on first interconnection layer;
H) forming a plurality of via holes in the intermetallic dielectric layer;
I) forming a second interconnection layer pattern in and above the plurality of via holes that form the bonding pad;
J) depositing a passivation layer above the second interconnection layer pattern; and
K) exposing the bonding pad by removing a portion of the passivation layer above the bond pad region.

The method may include an additional step after step B) of planarizing the interlayer dielectric before forming the contact hole. The method may also include an additional step before step I), wherein the plurality of via holes are filled with a conductive material such that the second interconnection layer pattern is formed above the plurality of via holes.

An alternate method for forming such a bonding pad structure may comprise the steps of:

A) forming a trench in a bonding pad region of the integrated circuit;
B) depositing an interlayer dielectric above the trench;
C) forming a recessed region in the interlayer dielectric above the trench;
D) forming a dummy pattern above the recessed region;
E) depositing another interlayer dielectric above the dummy pattern;
F) forming a peg in the interlayer dielectric above the dummy pattern;
G) forming a first interconnection layer pattern above the peg;
H) depositing an intermetallic dielectric layer;
I) forming a plurality of via holes in the intermetallic dielectric layer above the first interconnection layer pattern;
J) forming a second interconnection layer pattern in and above the plurality of via holes to form the bonding pad;
L) depositing a passivation layer above the second interconnection layer pattern; and
M) exposing the bonding pad by removing a portion of the passivation layer above the bond pad region.

In the foregoing method, the dummy pattern may be formed using a plurality of dummy layers, three dummy layers, for example. Further, the trench may be formed simultaneously with the formation of contact holes in a cell region of the IC or simultaneously with the formation of at least one electrical element.

These and other features of the present invention will be readily apparent to those of ordinary skill in the art upon review of the detailed description that follows.

BRIEF DESCRIPTION OF THE DRAWINGS

FIGS. 4-1 through 4-18 illustrate cross-sectional views of a bonding pad structure showing the steps of a method for manufacturing the bonding pads shown in FIGS. 2 and 3, wherein regions A2' and A2" provide for and show alternative embodiments of the present invention.

FIG. 5 illustrates a bonding pad structure according to a third embodiment of the present invention.

FIG. 6 illustrates a bonding pad structure according to a fourth embodiment of the present invention.

DESCRIPTION OF THE PREFERRED EMBODIMENTS

Korean Patent Application No. 2001-71828, filed on Nov. 19, 2001, and entitled "Bonding Pad Structure of a Semiconductor Device and Method for Manufacturing the same," is incorporated by reference herein in its entirety.

According to the present invention, in order to prevent a bonding pad of an integrated circuit (IC) from peeling during processing, a bonding pad anchoring structure is created which mechanically links each one of a plurality of upper layer bonding pads with lower layer dummy patterns via filled via holes that traverse the intervening layers. The linking structure is created simultaneously with the manufacture of other circuit elements of the IC and without the need for special or extra manufacturing processes. A combination of the anchoring structure and selection of interlayer materials having favorable adhesive compatibility properties provides a significantly improved bonding pad over conventional bonding pads.

Figure 2:
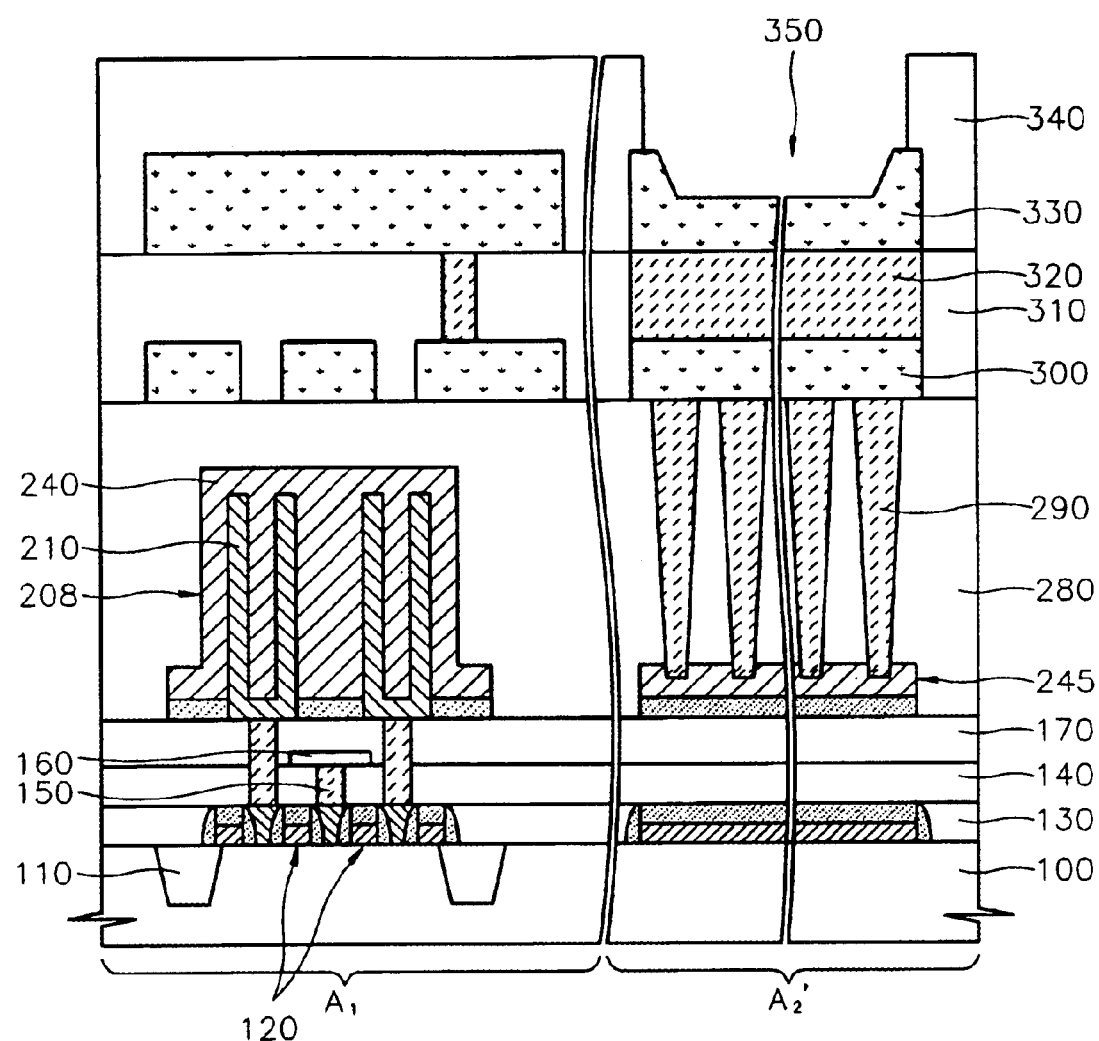
FIG. 2 illustrates a bonding pad structure according to a first embodiment of the present invention.

FIG. 2 illustrates a bonding pad structure according to a first embodiment of the present invention. An IC memory cell A1 comprising a capacitor 208 having electrodes 210 and 240 may be included in a first, a second, a third, and a fourth dielectric layers, 130, 140, 170, and 280, respectively.

The bonding pad structure is created beneath and connected to a bonding pad 350 simultaneously with the processing of the capacitor 208 of memory cell A1. Anchoring elements of the bonding pad structure preferably comprises a dummy pattern 245 being formed on the third interlayer dielectric 170, which is conductively and mechanically connected by a plurality of plugs 290 through interlayer dielectric 280 to a lower portion of a multi-layered bonding pad 350, and more specifically, to a first aluminum interconnection layer 300.

In order to connect first aluminum interconnection layer 300 to the dummy pattern 245, contact holes are formed in interlayer dielectric 280 in a bonding pad region A2' to the depth of dummy pattern 245, which also serves as a etch-stop for the contact holes. The contact holes are then filled with a metal, such as tungsten, preferably using a chemical vapor deposition (CVD) process, thereby forming plugs 290. Then preferably first aluminum interconnection layer 300 is selectively deposited over plugs 290 using a sputtering process, followed by a deposition of an intermetallic dielectric layer 310. Intermetallic dielectric layer 310 is then selectively etched in the region of the bonding pad to created a contact hole 320, which is then filled with a suitable metal for connecting aluminum interconnection layer 300 to subsequently deposited bonding pad 350. As a result of the linking to dummy pattern 245 by plugs 290, the first aluminum interconnection layer 300 has significantly improved resistance to peeling or lifting at the interface between the first aluminum interconnection layer 300 and interlayer dielectric 280. In addition, such a bonding pad structure can re-distribute stress caused by a mechanical impact and pressure applied when an external connecting wire is bonded to the bonding pad 350. After construction of the bonding pad structure, a passivation layer 340 is deposited on the exposed surface of the IC. The passivation layer 340 is then etched back to expose contact metal of the bonding pad 350. Such etching is preferably performed via plasma etching.

Figure 3:
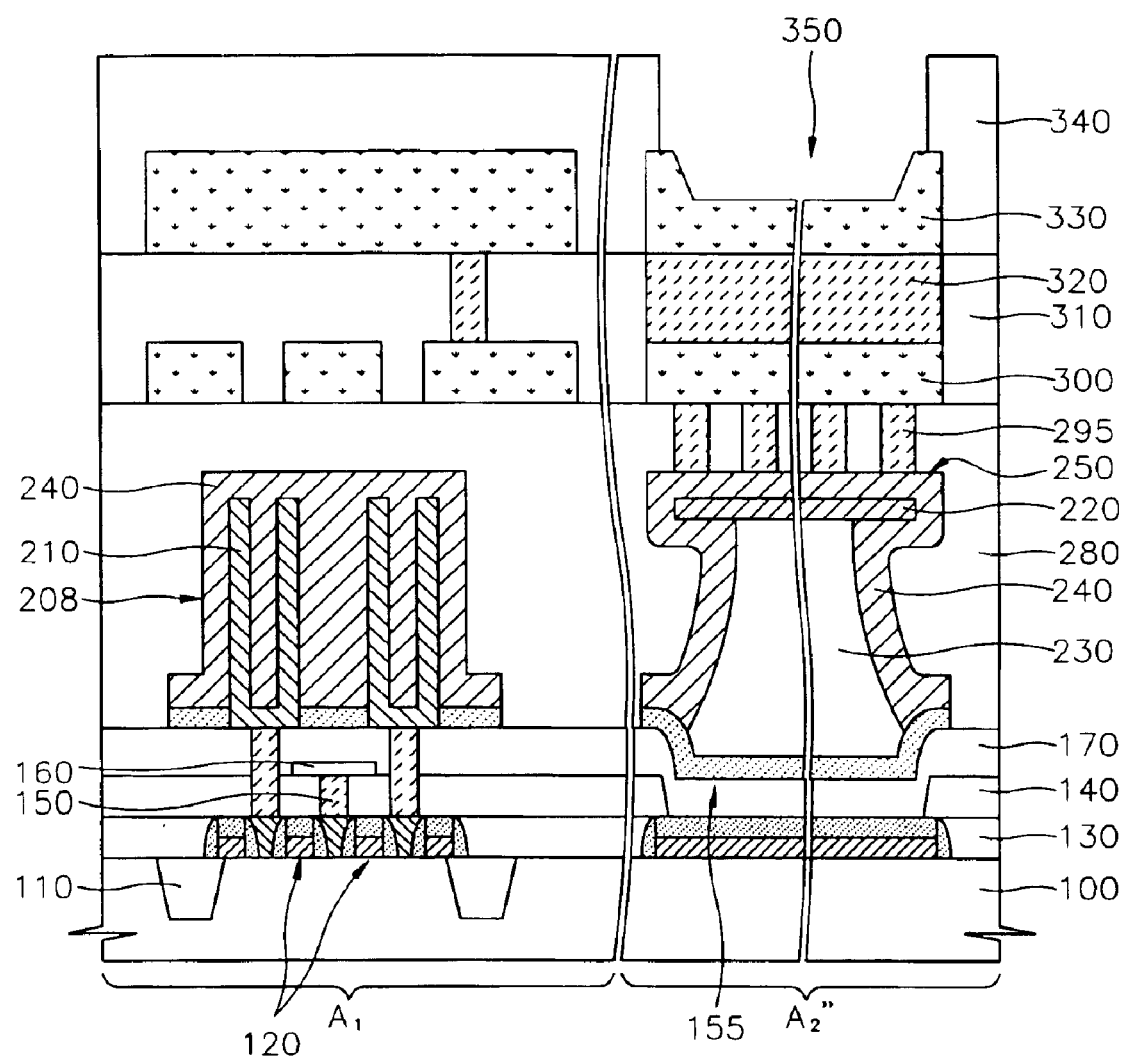
FIG. 3 illustrates a bonding pad structure according to a second embodiment of the present invention.

FIG. 3 illustrates a bonding pad structure according to a second embodiment of the present invention. A principal feature of the second embodiment is the minimization of the depth of conical shaped contact holes and plugs 290 as shown in the first embodiment in FIG. 2. To create this depth minimization, dummy pattern 245 of FIG. 2 is raised to the level of the top surface of the capacitor 208. As shown in FIG. 3, an elevated dummy pattern comprising elements 220, 230, and 250 allows for the use of shorter plugs 295. Such shorter plugs 295 provide more protection from discontinuities that may occur due to a natural tapering of deeply etched holes coupled with the possible presence of impurities and/or incomplete metallic deposition at the narrow bottom of the contact hole, particularly in high density IC's.

FIGS. 4-1 through 4-18 illustrate cross-sectional views of a bonding pad structure showing the steps of a method for simultaneously manufacturing a bonding pad in either bonding pad region A2' or A2" and a cell capacitor 208 in a memory cell region A1 after forming a memory switching transistor 120. In FIGS. 4-1 through 4-18, bonding pad regions A2' and A2" are shown in the same drawing figures for the purpose of providing for and showing alternative embodiments of the present invention without restricting the scope of the present invention to the drawings. Accordingly, it is to be understood that bonding pad region A2' represents one embodiment of the present invention, and bonding pad region A2" represents another embodiment of the present invention. It is also to be understood, however, that the embodiments shown in FIGS. 4-1 through 4-18 do not limit the scope of the present invention as they are provided as preferred embodiments of the present invention without limiting the scope of the present invention as claimed.

Referring to FIGS. 4-1 through 4-7, a shallow trench isolation (STI) region is preferably formed on a semiconductor substrate 100 and is bounded by device isolation regions 110 with an active region being provided between the isolation regions 110, wherein transistor 120 is formed. A first interlayer dielectric 130 is then deposited over the entire surface of the semiconductor substrate 100 and transistor 120, which is then planarized preferably by a chemical mechanical polishing (CMP) process to produce a uniform surface for subsequent deposition layers.

Figures 1, 4:
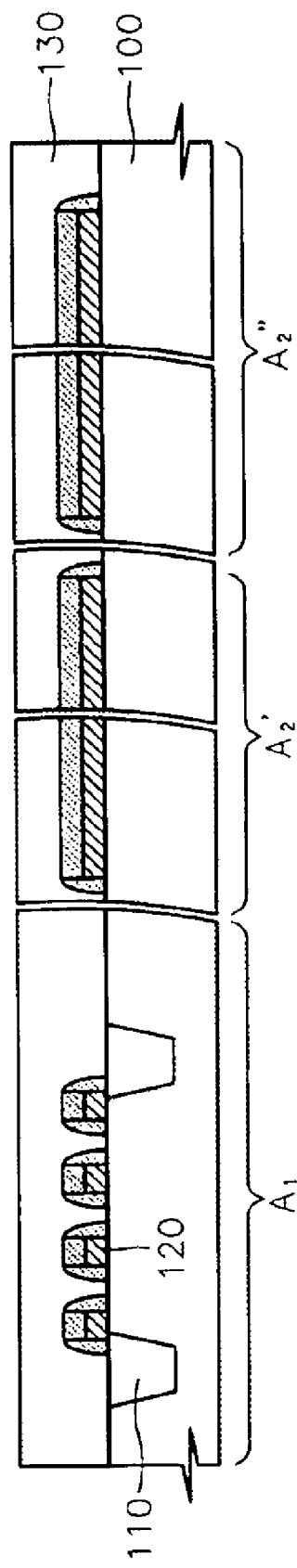
Figures 2, 4:
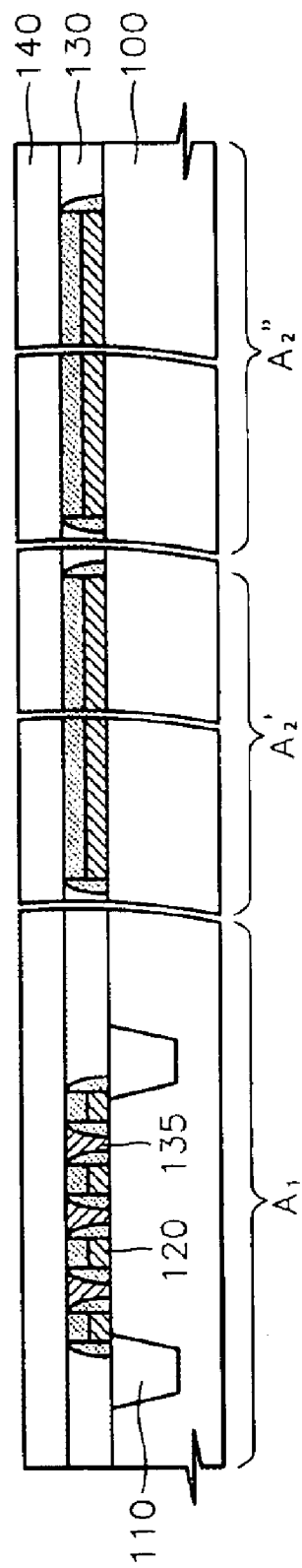
Figure 4:
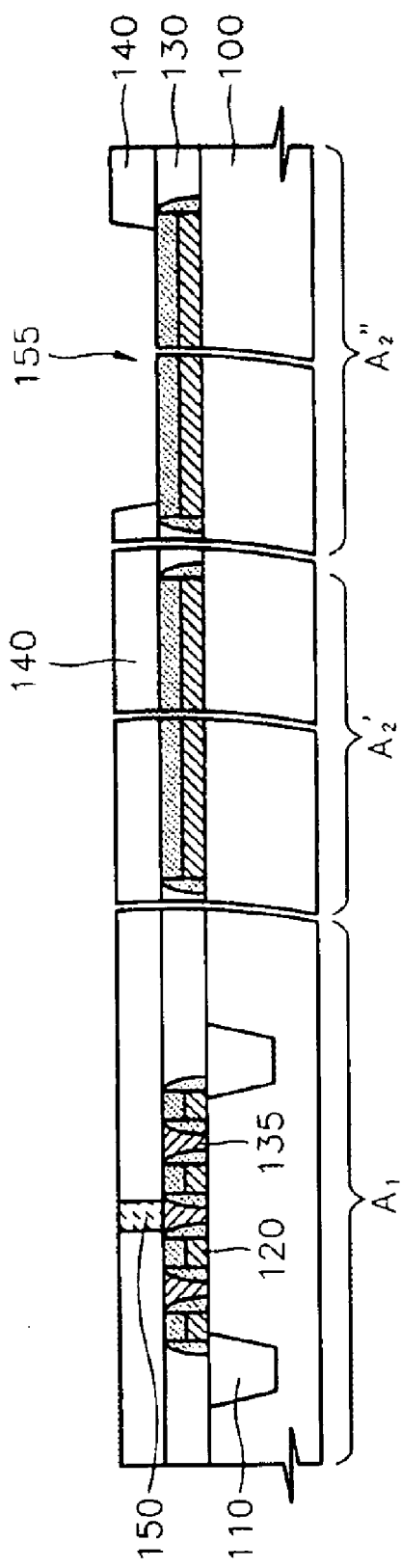

Next, a contact pad 135 is formed, and a second interlayer dielectric 140 is then deposited on the entire surface of the semiconductor. An etching process is then performed on the second interlayer dielectric 140 to simultaneously form an exemplary contact hole (direct contact hole) 150 for electrically connecting a source/drain region of transistor 120 to a bit line in cell region A1, and a trench 155 as shown in FIG. 4-3. The size of trench 155 is preferably similar in size to a subsequent overlaying bonding pad like bonding pad 350 of FIGS. 1-3.

As shown in FIG. 4-4, direct contact hole 150 is then filled with conducting material such as tungsten, preferably deposited by a chemical vapor deposition (CVD) process. The conducting material is preferably deposited over the entire second interlayer dielectrics 140 and then removed from trench 155 using an etch-back process. Conductive lines, such as a bit line 160 are formed, and a third interlayer dielectric 170 is then deposited over the assembly as shown in FIG. 4-5.

Figure 1:
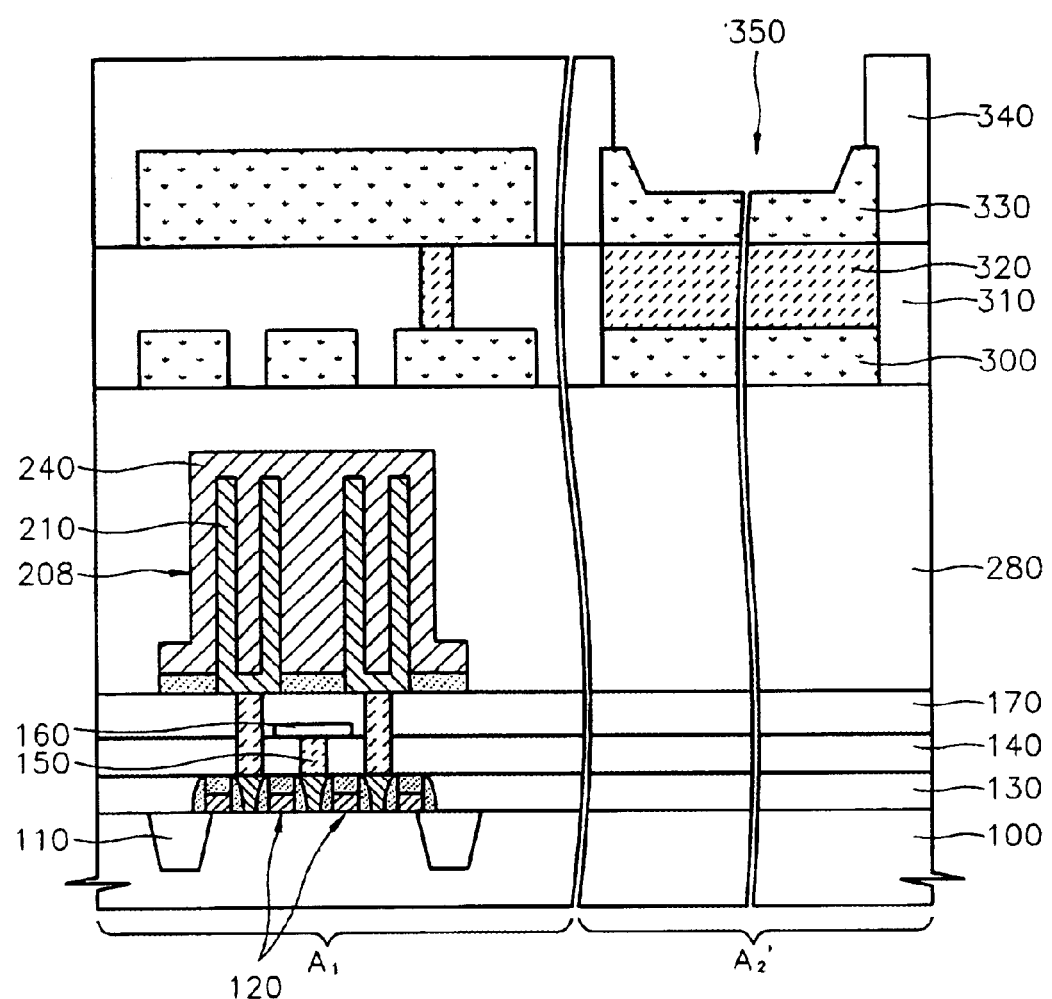
FIG. 1 illustrates a cross-sectional view of conventional semiconductor memory device.
Figures 4, 5:
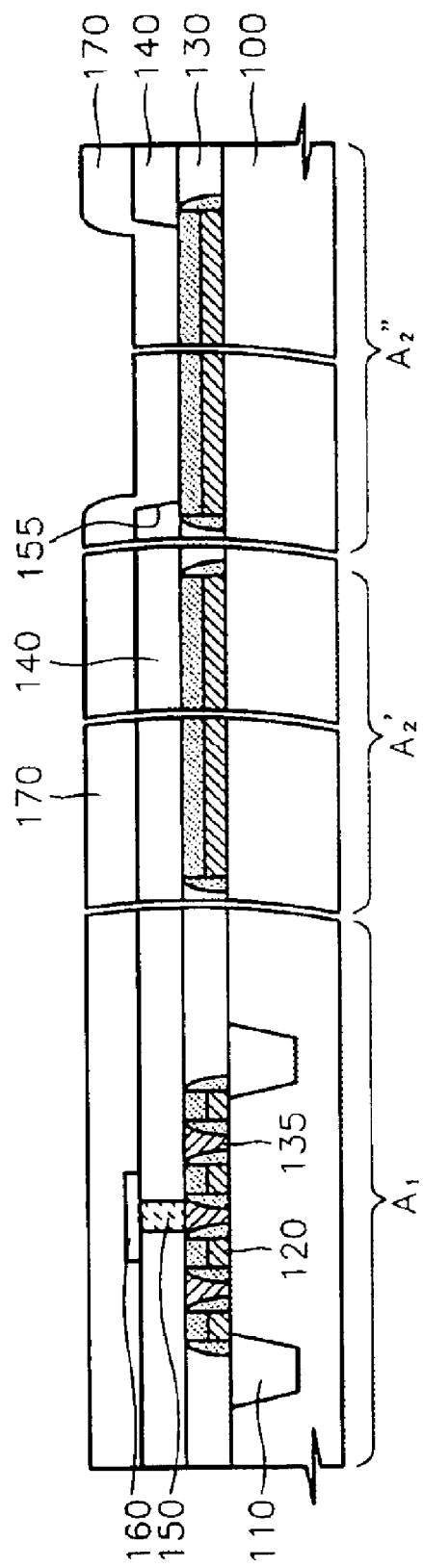
Figures 4, 5, 6:
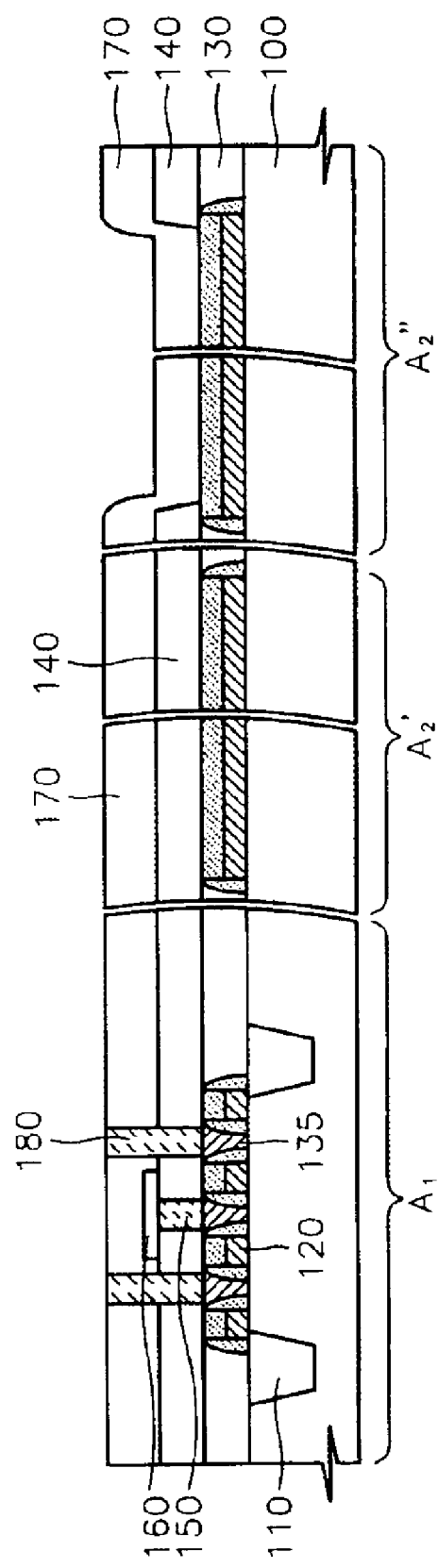
Figures 4, 5, 6, 7:
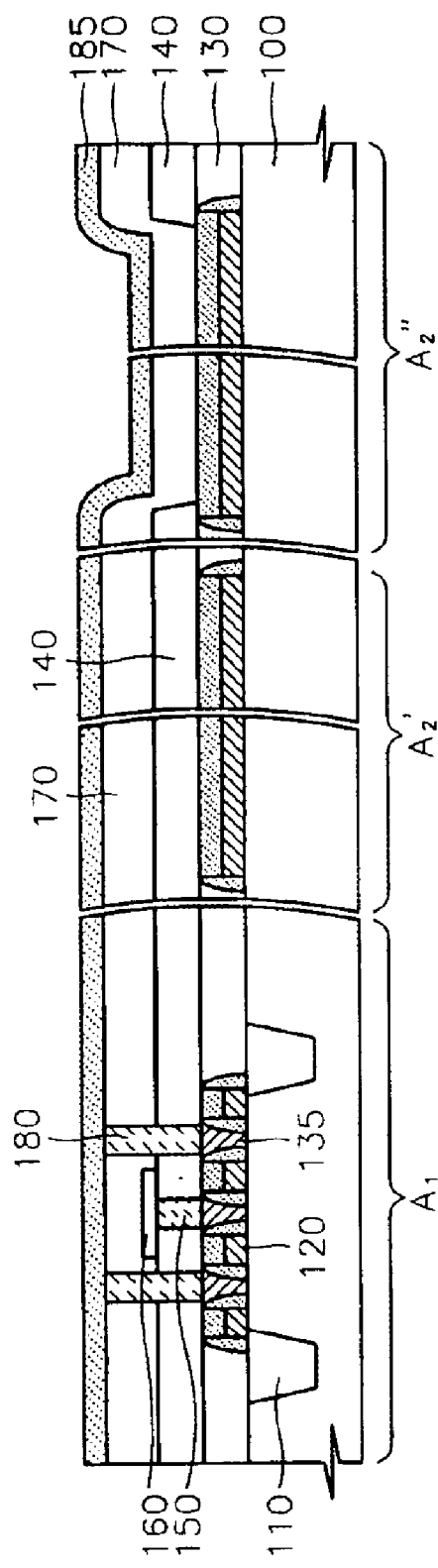
Figures 4, 5, 6, 7, 8:
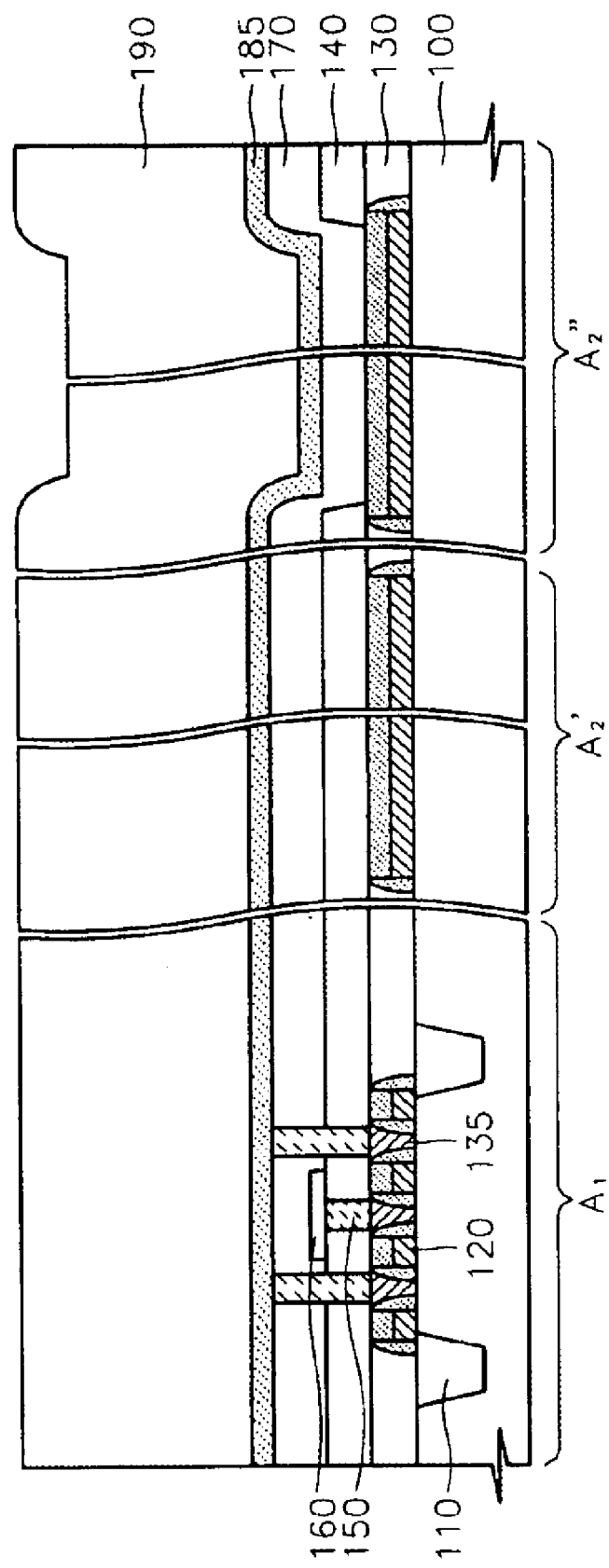
Figures 4, 5, 6, 7, 8, 9:
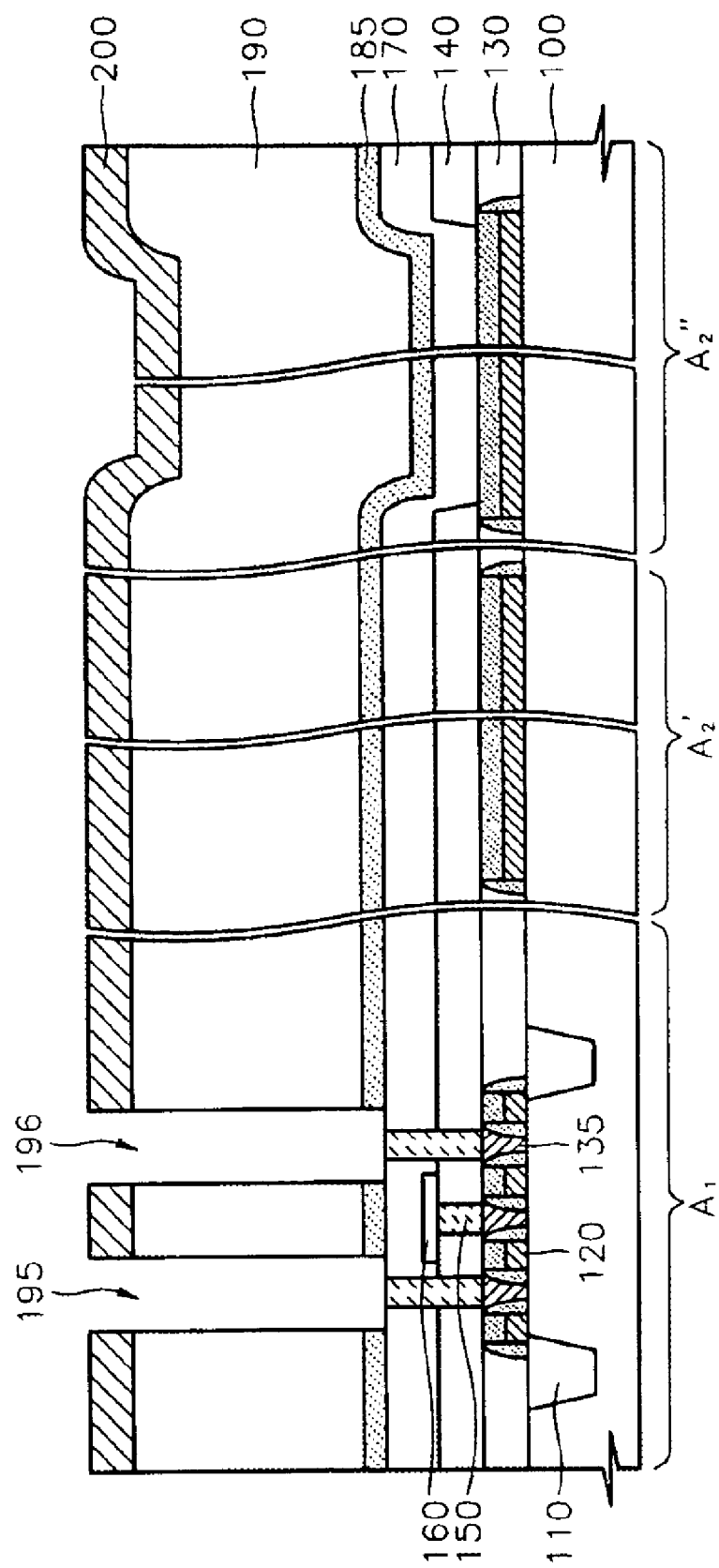
Figures 4, 5, 6, 7, 8, 9, 10:
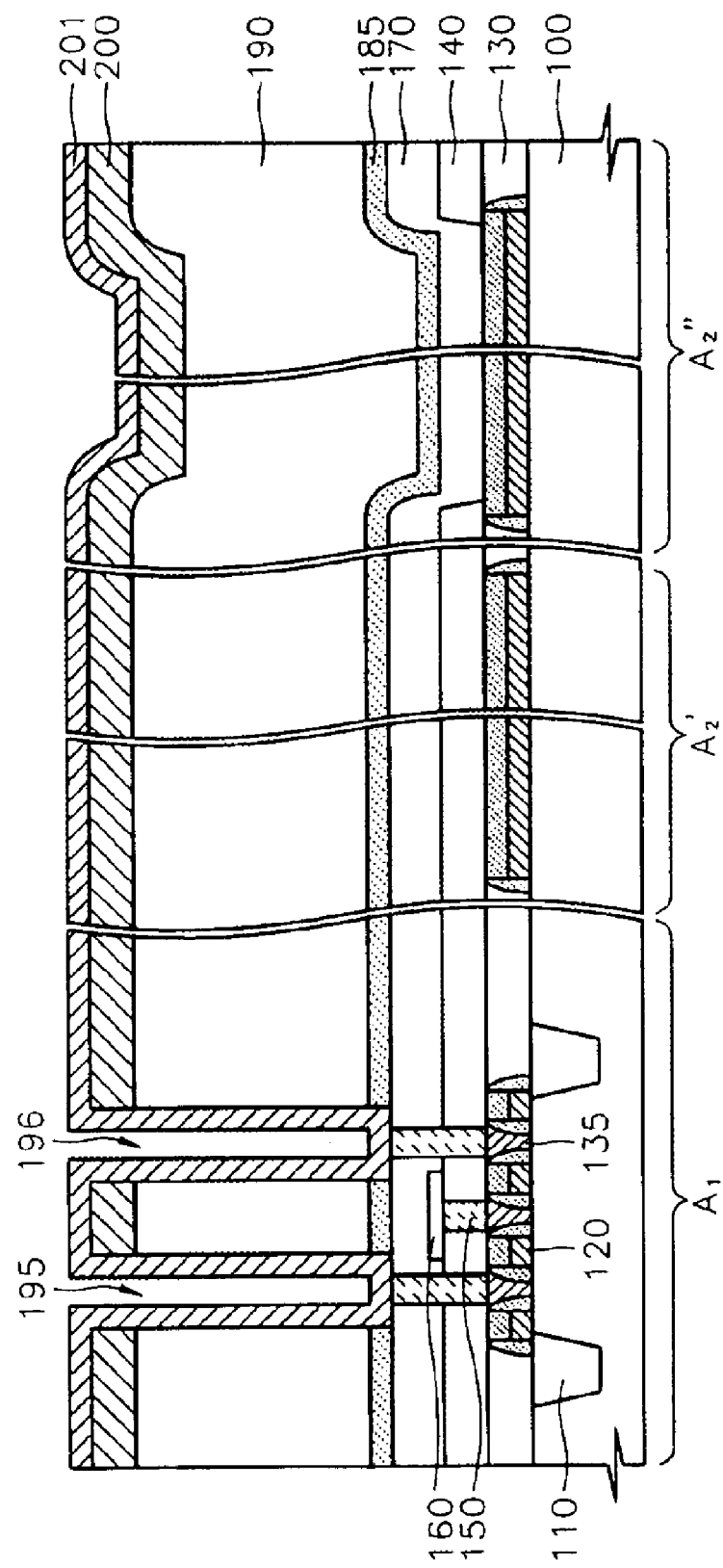
Figures 4, 5, 6, 7, 8, 9, 10, 11:
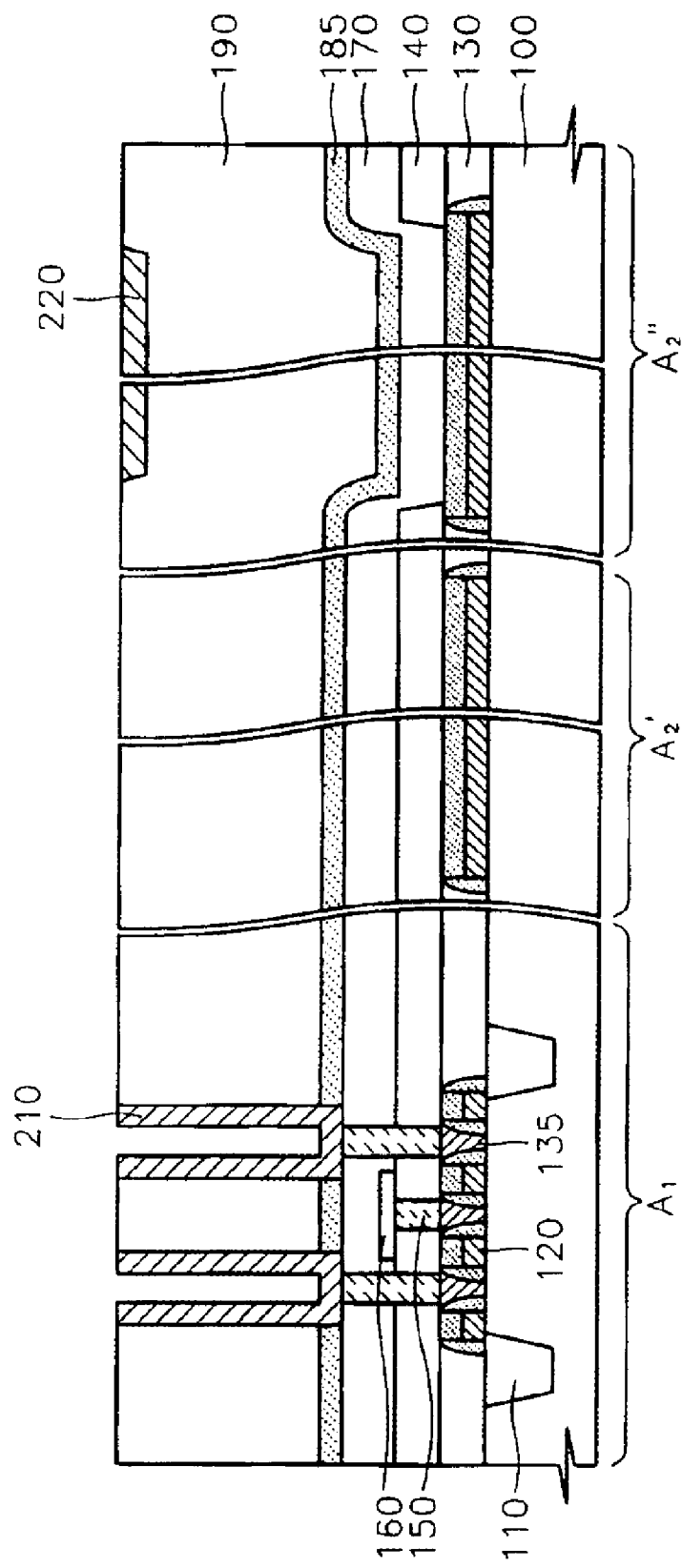
Figures 4, 5, 6, 7, 8, 9, 10, 11, 12:
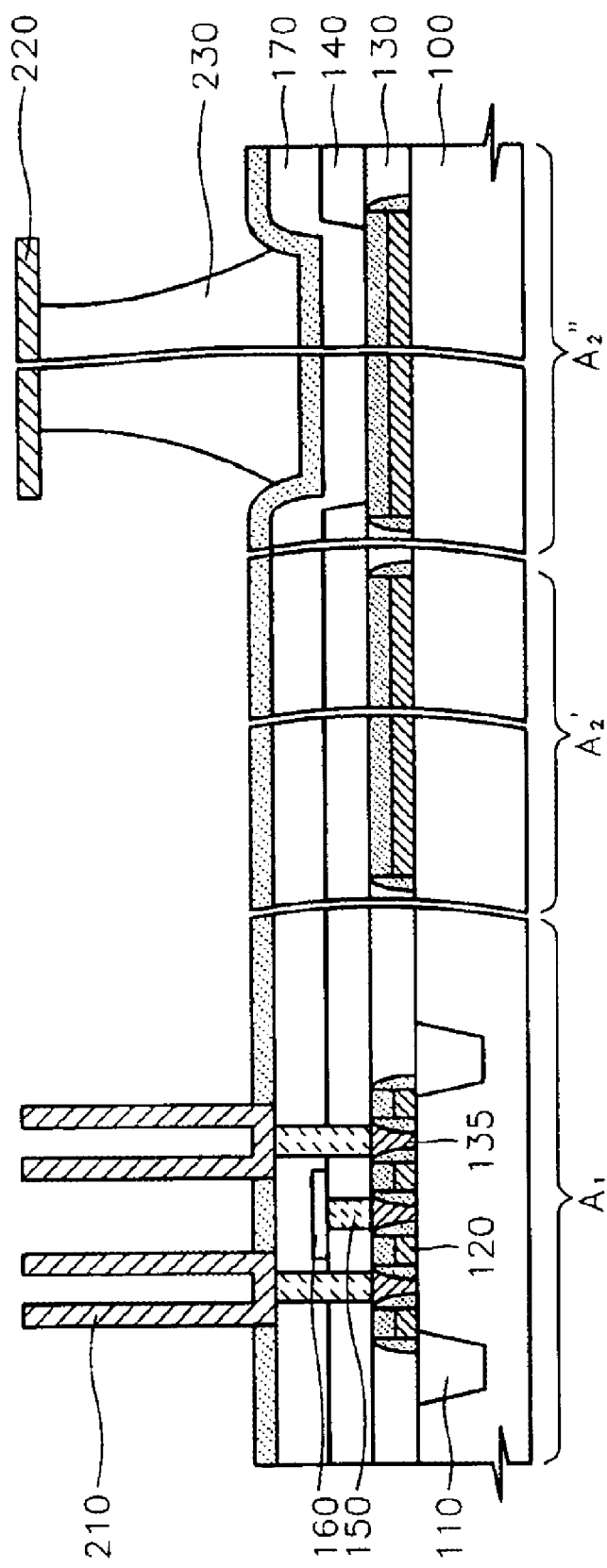
Figures 4, 5, 6, 7, 8, 9, 10, 11, 12, 13:
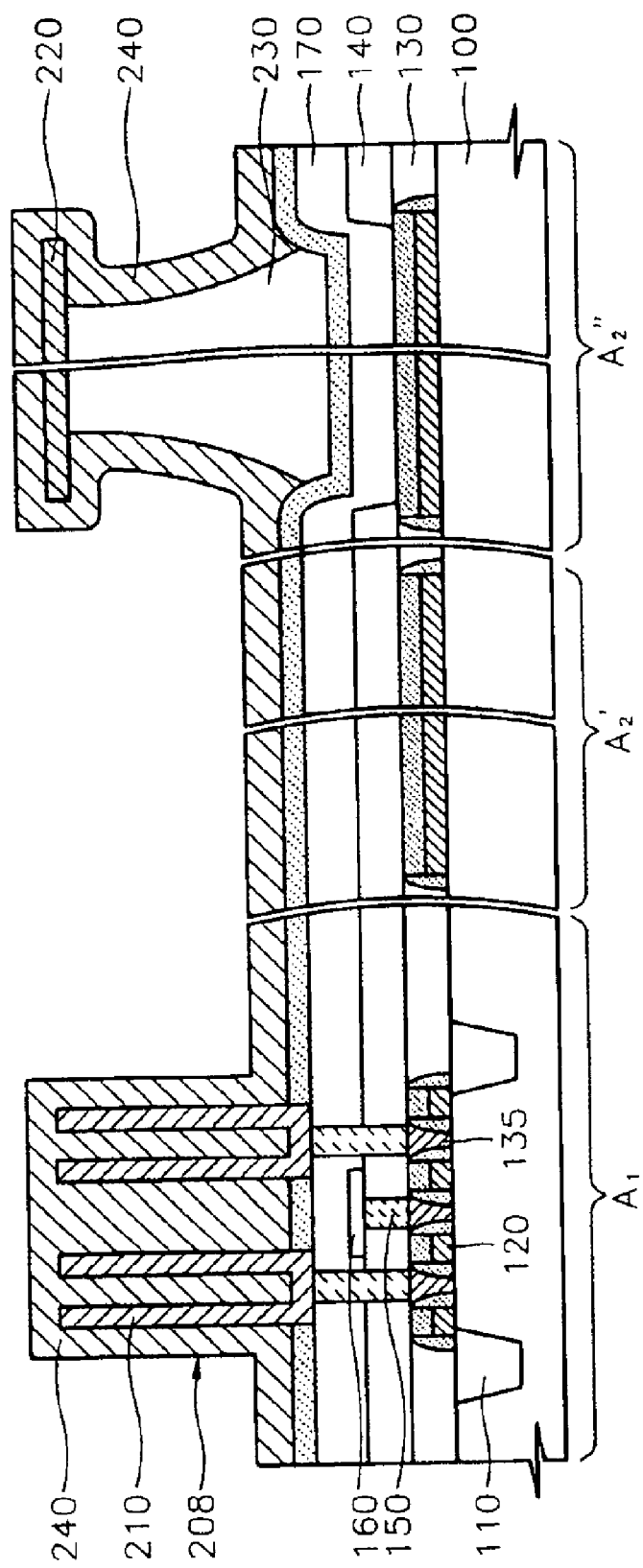
Figures 4, 5, 6, 7, 8, 9, 10, 11, 12, 13, 14:
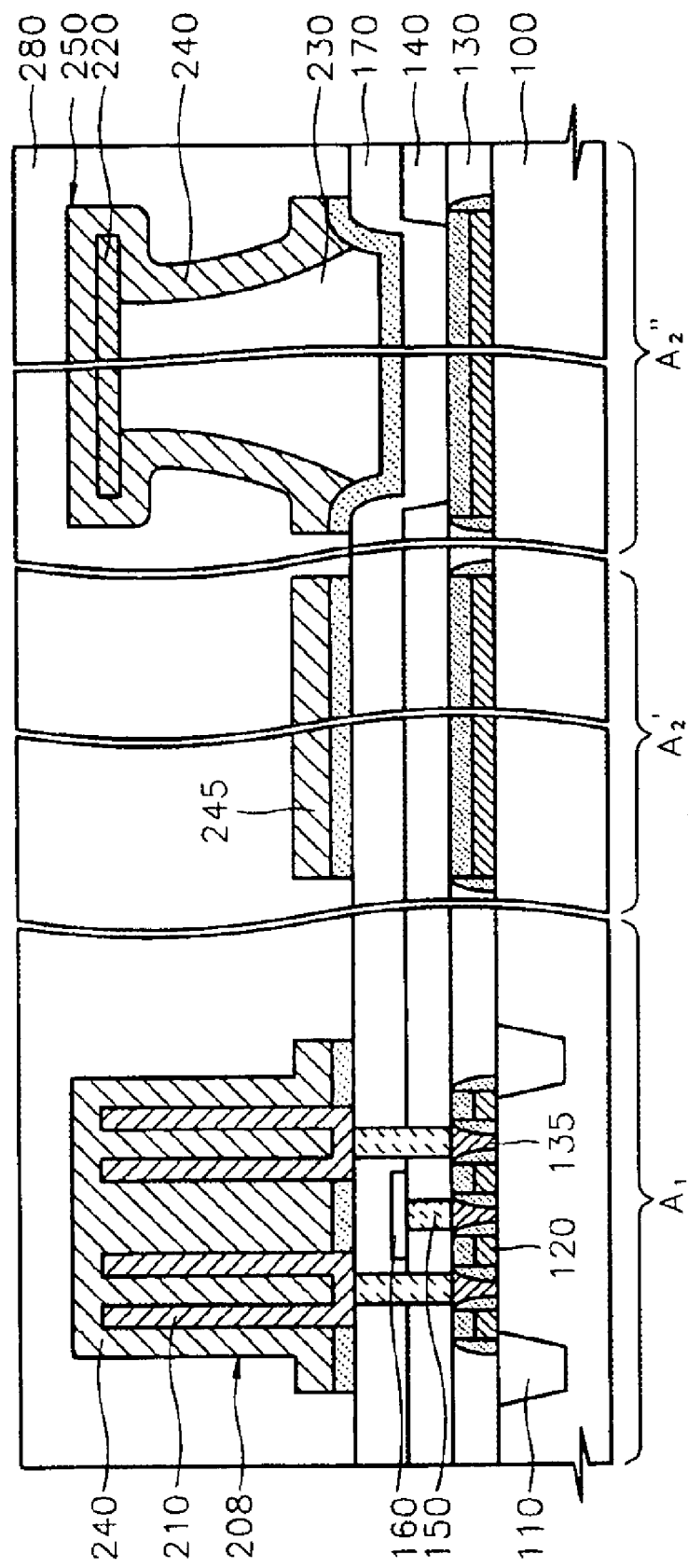
Figures 4, 5, 6, 7, 8, 9, 10, 11, 12, 13, 14, 15:
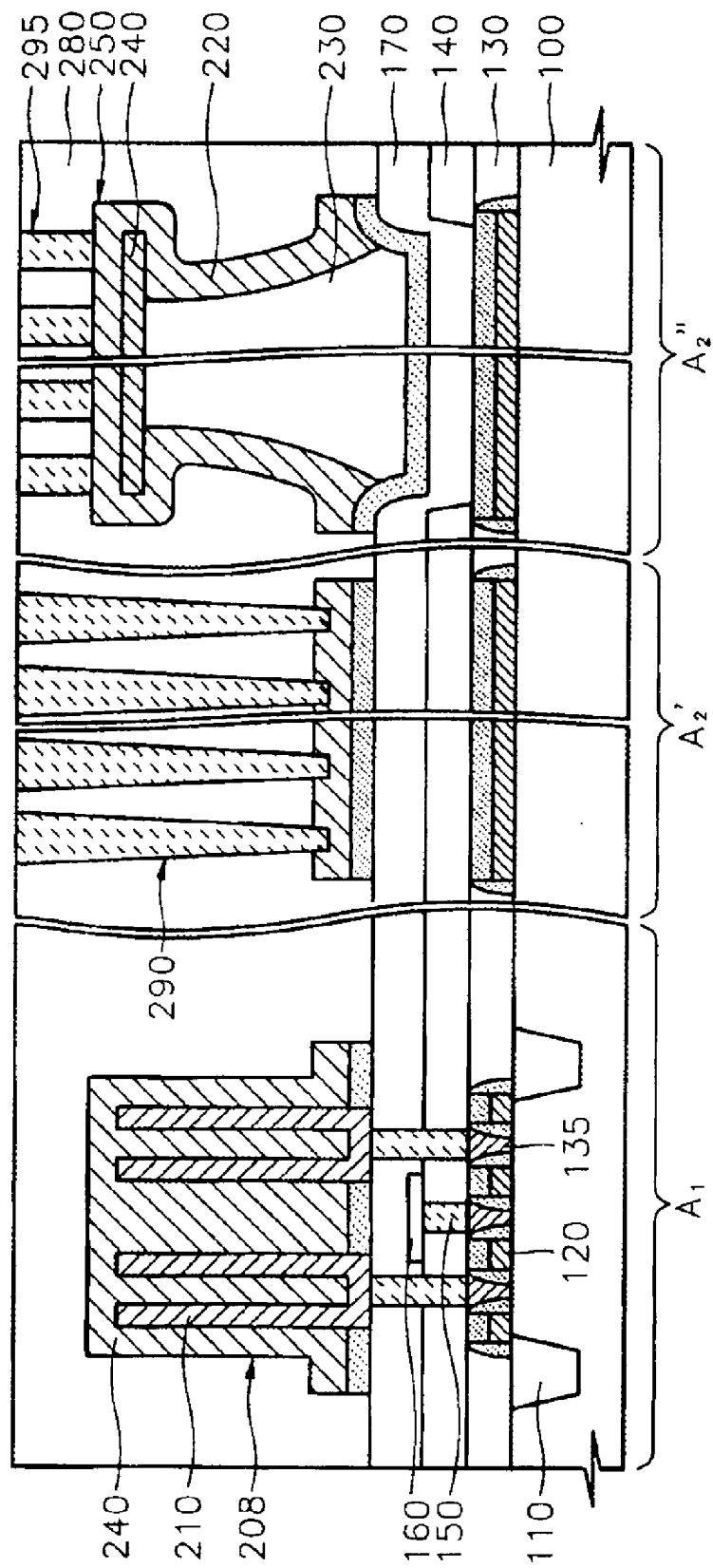
Figures 4, 5, 6, 7, 8, 9, 10, 11, 12, 13, 14, 15, 16:
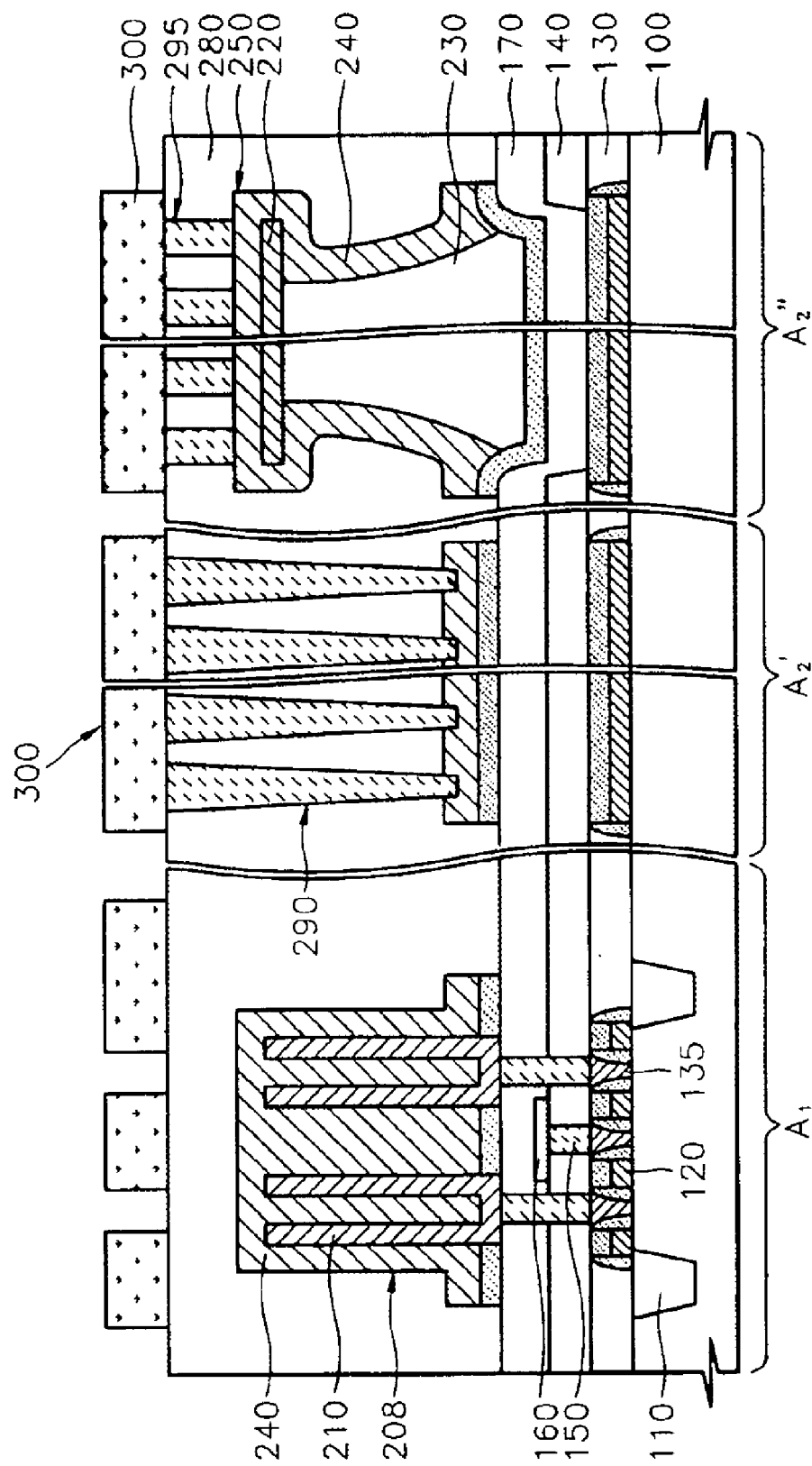
Figures 4, 5, 6, 7, 8, 9, 10, 11, 12, 13, 14, 15, 16, 17:
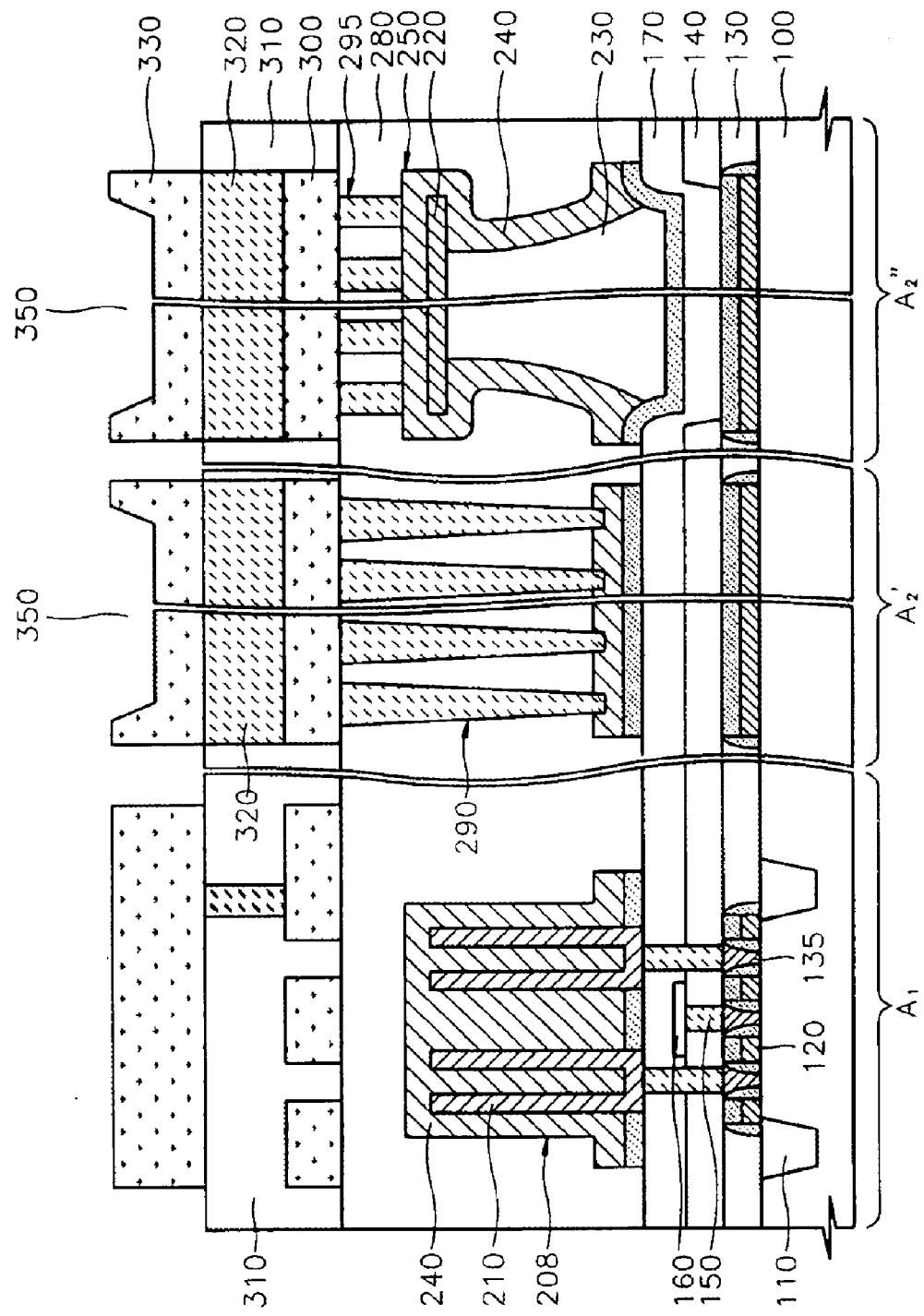
Figures 4, 5, 6, 7, 8, 9, 10, 11, 12, 13, 14, 15, 16, 17, 18:
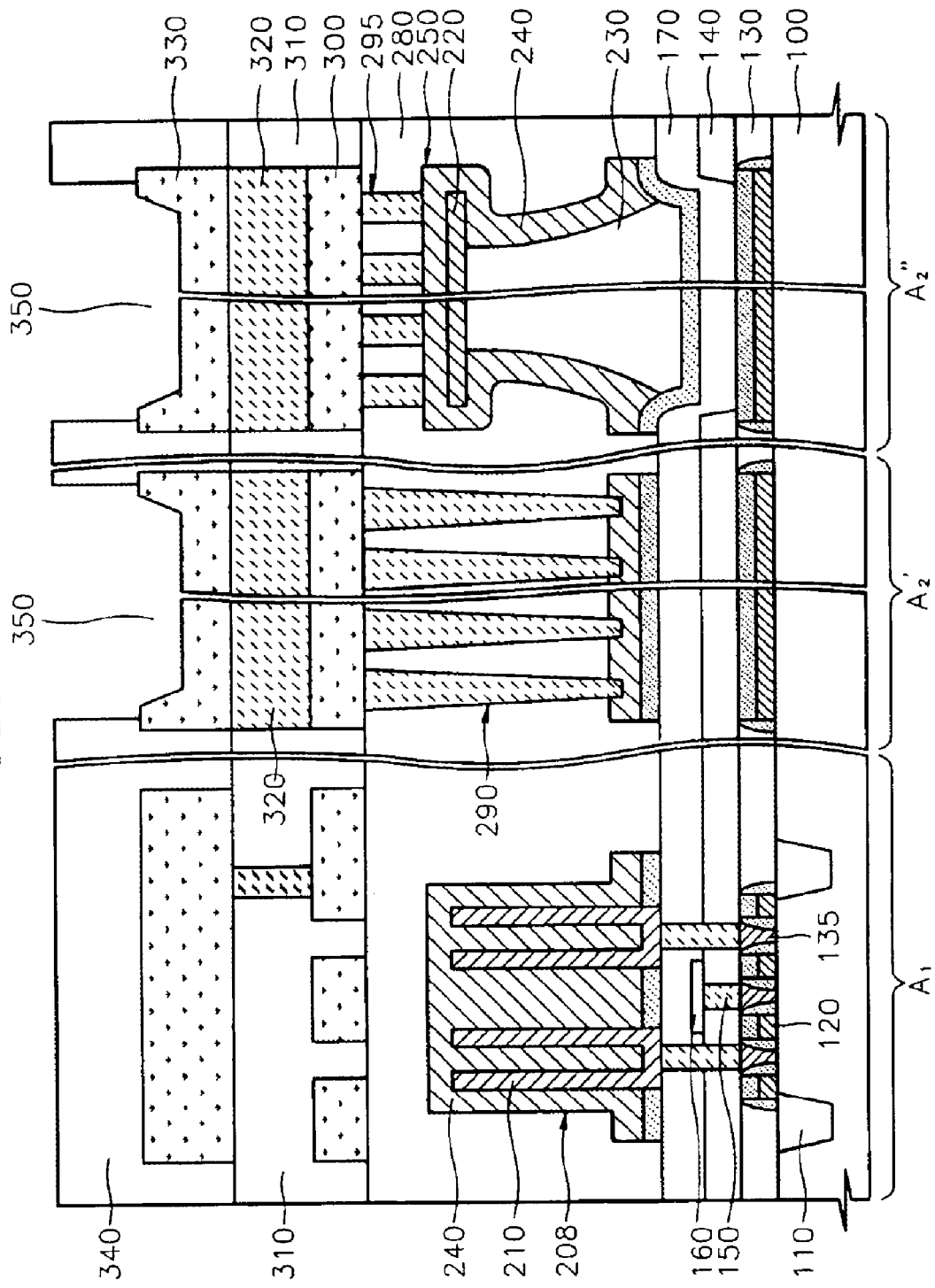
Figure 5:
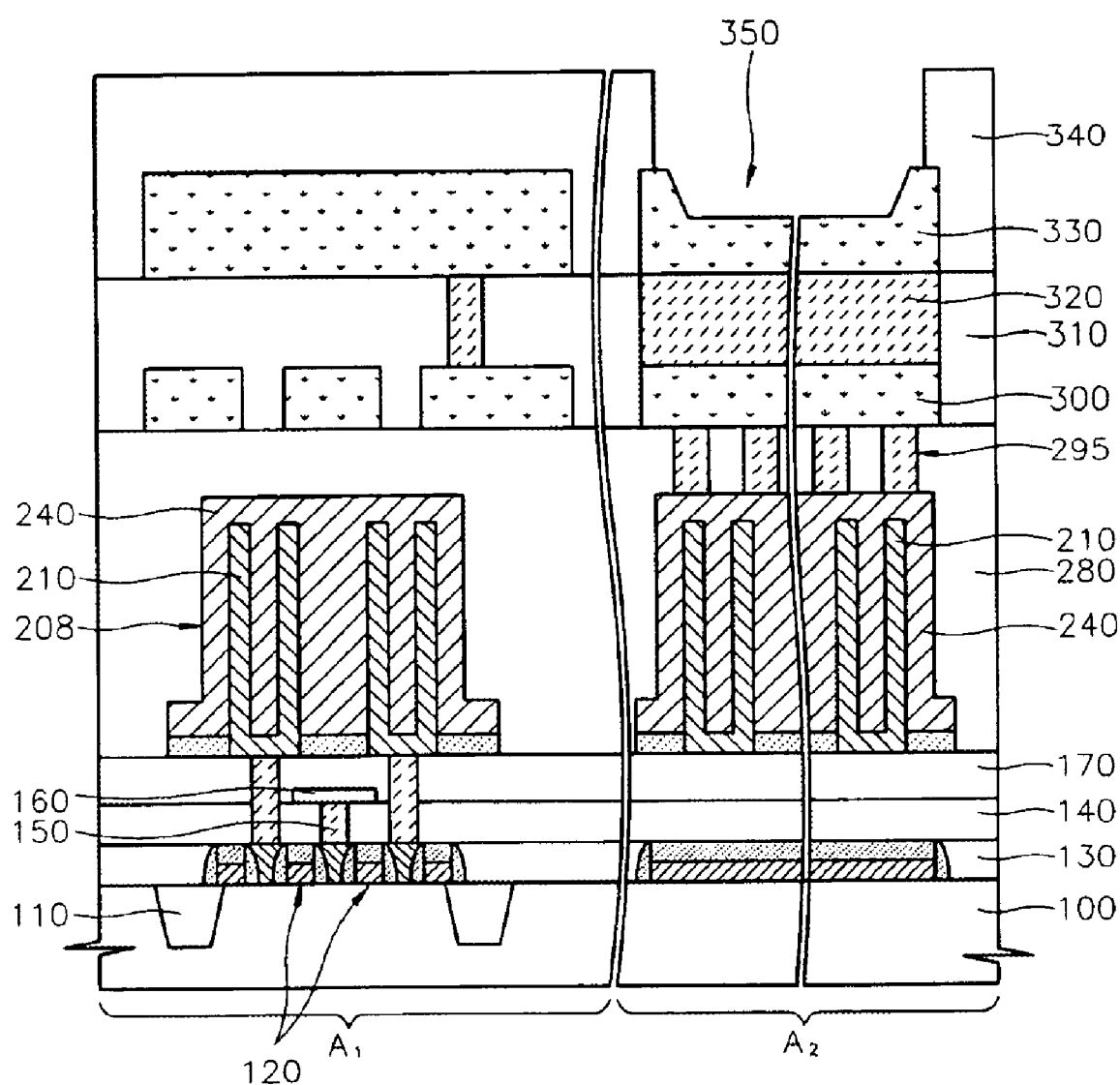
Figure 6:
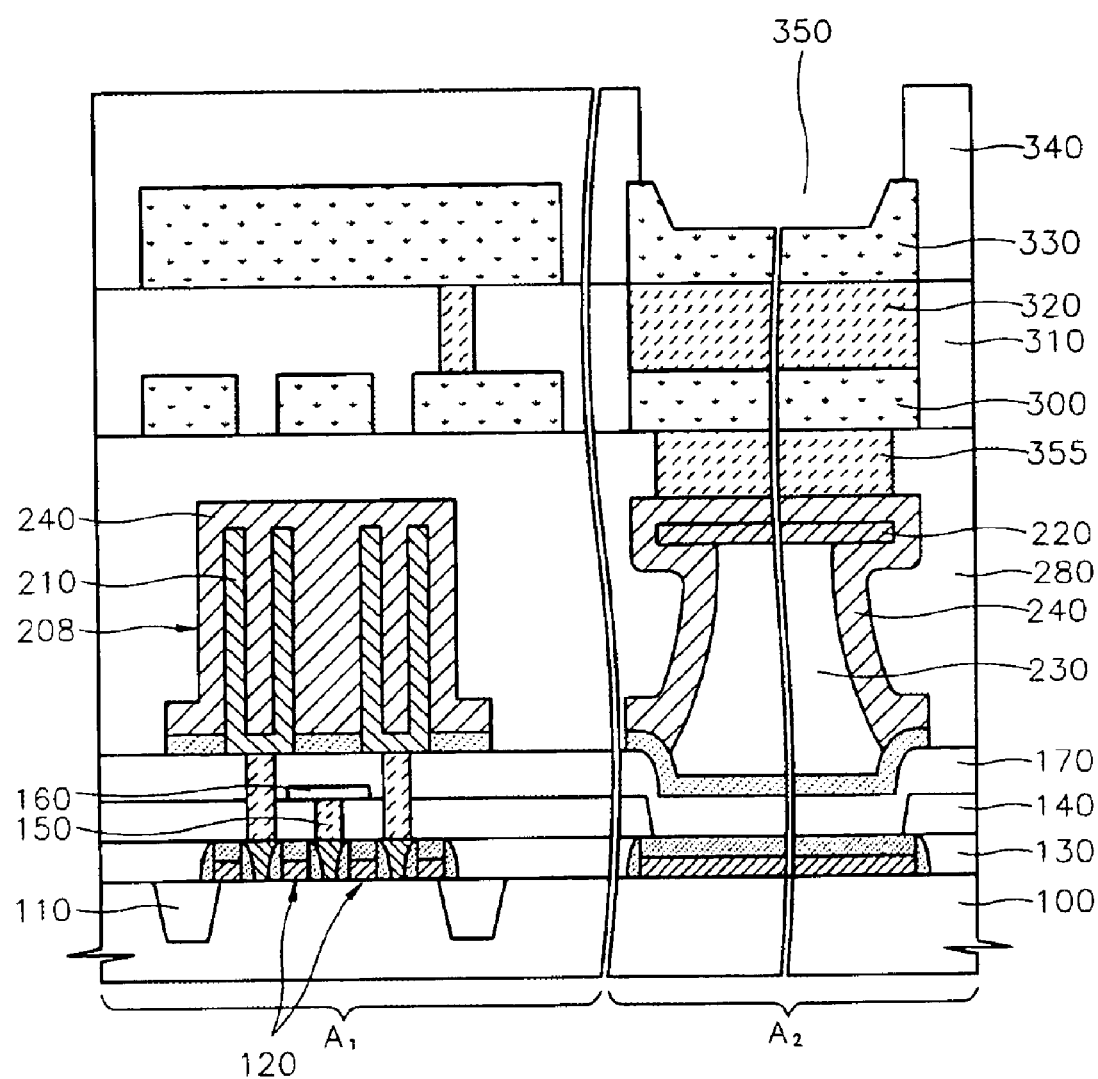

In a next representative step, as shown in FIG. 4-6, a contact hole (buried contact hole) 180 is formed in the third interlayer dielectric 170 in order to provide an exemplary connection between a lower electrode of capacitor 210 and a source/drain region of the transistor 120 as shown in FIGS. 1-3. Buried contact hole 180 is then filled with conducting material, such as doped polycrystalline silicon. An etch-stopping layer 185 is then deposited on the entire surface of the assembly as shown in FIG. 4-7. As shown in the right portion of FIG. 4-7, a depression having a step difference of as much as the depth of the trench 155 of FIG. 4-3 may remain on the surface of the assembly even after the formation of third interlayer dielectric 170 and etch-stopping layer 185.

The etch-stopping layer 185 may be comprised of a silicon nitride ($Si_3N_4$), and the first, second and third interlayer dielectric layers 130, 140 and 170, respectively, may be formed of a silicon oxide material. The size (the lateral dimensions or diameter) of trench 155 is dependent on the size of the bonding pad 350. For example, trench 155 preferably has a surface area of no greater than 100 $\mu$m×100 $\mu$m, which is equivalent to the area of representative bonding pad 350, and a trench depth of 0.2≧0.5 $\mu$m. The first, second, and third interlayer dielectric 130, 140 and 170, respectively, may be formed to a thickness of 0.3–1.0 $\mu$m, respectively. The etch-stopping layer 185 may be formed to a thickness of 50–500 Å.

Referring to FIG. 4-8, a mold oxide layer 190 is preferably formed on the entire surface of the assembly in order to form a lower electrode of a cylindrically-shaped capacitor on etch-stopping layer 185. Mold oxide layer 190 is preferably formed of a silicon oxide layer using a CVD process, with the thickness of mold oxide layer 190 being dependent on the height of the lower electrode of the capacitor, which in most cases, may be about 1.0–2.0 $\mu$m. Since the area occupied by trench 155 in bonding pad region A2" is very large, the previously noted surface step-difference depression will still exist on the surface of mold oxide layer 190.

Referring to FIGS. 4-9 and 4-10, a pair of holes 195 and 196 are formed in mold oxide layer 190 to create the lower electrodes (reference 210 of FIGS. 1-3) of the capacitor 208. In a highly integrated memory device, such as one having a 256 megabyte capacity, the size of such a hole may be about 0.25 $\mu$m in diameter. Due to the difficulty in patterning such a fine size and pitch in a mold oxide layer, such as layer 190, using a conventional photoresist mask, holes 195 and 196 are preferably formed using a hard mask 200, comprised of polycrystalline silicon. Hard mask 200 preferably extends over bonding pad region A2' to protect mold oxide layer 190 in region A2' from being etched during the hole etching process.

After forming hole patterns 195 and 196 in mold oxide layer 190, polycrystalline silicon is preferably deposited to a thickness of 1000–5000 Å over the entire surface of the assembly. In order to make the polycrystalline silicon conductive, the polycrystalline silicon is doped with a high concentration of impurities. The deposited film 201 is shown in FIG. 4-10.

Referring to FIG. 4-11, an etching process, such as a chemical mechanical polishing process, is performed on the resulting assembly to isolate the lower electrodes 210 in cell region A1. During this process, hard mask layer 200 and the doped polycrystalline silicon film 201 on mold oxide layer 190 are preferably removed.

After completion of the etching process, polycrystalline silicon preferably remains in the sidewalls and bottoms of holes 195 and 196 and in the previously mentioned depression in bonding pad region A2". This polycrystalline silicon remnant forms a first dummy pattern 220, which is used in the formation of the bonding pad structure. In order to prevent over-etching, which may completely remove first dummy pattern 220, the amount by which polycrystalline silicon is etched must be appropriately controlled in order to leave a desired amount of polycrystalline silicon material in the recessed region of mold oxide layer 190.

Referring to FIG. 4-12, mold oxide layer 190, having a representative thickness of 1.0–2 $\mu$m, may now be removed using a wet etchant such as HF. Since etch-stopping layer 185 cannot be removed by the HF, the underlying material of mold oxide layer 190 is protected from the HF-etching process. After completion of the HF-etching process, lower electrode 210 is completely exposed in cell region A1, and a second dummy pattern 230 is created in mold oxide layer 190 in the bonding pad region A2" from the masking effects of the first dummy pattern 220 as shown in FIG. 4-12. Since wet etching is isotropical, the sidewalls of the second dummy pattern 230 are partially etched so that portions of the first dummy pattern 220 are undercut. However, a reduction in the sidewall thickness of the second dummy pattern 230 is preferably only 1.0–2 $\mu$m, which is negligible when compared with the representative 100 $\mu$m×100 $\mu$m area of second dummy pattern 230. A capacitor dielectric layer (not shown) is then formed on lower electrodes 210 of the capacitor.

Referring to FIG. 4-13, in order to form an upper electrode 240 of the capacitor, a polycrystalline silicon layer is deposited over the entire surface of the assembly as shown in FIG. 4-13. In the bonding pad region A2", polycrystalline silicon is formed to completely cover the first dummy pattern 220 and the second dummy pattern 230. Referring to FIG. 4-14, the upper electrode 240 is then patterned preferably using photolithography techniques. During this process, a third dummy pattern 250 is preferably formed in bonding pad region A2". A fourth interlayer dielectric 280 is then deposited by CVD over the entire surface of the assembly and is planarized using a CMP or etch-back process.

At this point, a metal interconnection layer and a hole for a device contact plug (not shown) may be formed in cell region A1, as shown in FIG. 4-15. In order to create the bonding pad structure for bonding pad 350 in bonding pad region A2", a plurality of holes for a plurality of bonding pad contact plugs 295 are formed. The holes for bonding pad contact plugs 295 are preferably formed as having either a ring-shape or a mesh-shape. Note however, that as the depth of a bonding pad contact hole increases, it becomes more difficult to form a hole pattern into a mesh-shape.

As shown in FIGS. 4-16 through 4-18, as the depth of the hole for bonding pad contact plug decreases, such as that in bonding pad regions A2" relative to that in bonding pad region A2', it becomes easier to form the hole and tungsten plug 295 than to form the hole and tungsten plug 290 in bonding pad region A2' in a subsequent manufacturing process. The holes for bonding pad contact plugs 290 and 295 are preferably etched under a condition where an etching selection ratio of an oxide layer with respect to a polycrystalline silicon layer is high, such that an etching process can be finished at the polycrystalline silicon layer. After etching, the holes for bonding pad contact plugs 290 and 295 are filled with tungsten preferably using a CVD process. The resulting assembly is then chemically and mechanically polished or etched back, thereby forming a tungsten plug. The results of the foregoing process steps create an anchoring structure for a robust bonding pad structure.

Referring to FIG. 4-16, after forming the tungsten plugs 290 and 295, a first aluminum interconnection layer 300 is formed. An intermetallic dielectric layer 310 is then deposited over aluminum interconnection layer 300 as shown in FIG. 4-17. A contact hole 320 is then formed in the intermetallic dielectric 310, and a second aluminum interconnection layer 330 is formed to produce the completed "hour-glass" structure of bonding pad 350.

As shown in FIG. 4-18, a passivation layer 340 is deposited over the entire surface of the assembly to protect the completed IC. In a final step, bonding pad 350 is exposed by selective etching at the bonding pad locations, producing a de-lamination resistant bonding pad 350.

According to the second embodiment, as shown in the processing of bonding pad region A2" in FIGS. 4-1 through 4-18, smaller depth of a bonding pad contact hole allows for easier and more uniform formation of both the bonding pad contact holes and the tungsten filler plugs 295. As was shown in the preceding steps for bonding pad region A2', the dummy patterns under the bonding pads may be easily formed at the same time and during the same process steps that were used for the construction of the capacitor, i.e. without the need of extra process steps, or at most a minimum number of additional steps.

FIG. 5 illustrates a bonding pad structure according to a third embodiment of the present invention. In the embodiment illustrated in FIG. 5, a trench is not formed in the second interlayer dielectric 140, unlike in the second embodiment. In this embodiment, a capacitor pattern may be constructed beneath the bonding pad 350 for use as a dummy pattern, rather than the dummy pattern in trench 155 of FIG. 4-3, thereby eliminating the associated subsequent depression processing effects. In addition, in this embodiment, lower and upper electrodes 210 and 240, respectively, of the capacitor may be formed in both the cell region A1 and the bonding pad region A2 at the same time. A capacitor dielectric layer (not shown) is formed after the formation of the lower electrode 210 and before the formation of upper electrode 240 of the capacitor. The capacitor pattern formed in the bonding pad region A2 is a dummy pattern and does not need to act as a capacitor. One bonding pad and two dummy capacitor patterns are shown in bonding pad region A2 in FIG. 5. However, an exemplary size of such a capacitor may be 0.2 μm–0.5 μm, whereas the bonding pad has a representative area of 100 μm×100 μm. Under such circumstances, a number of such dummy capacitor patterns may be needed under the bonding pad to provide the desired anchoring effects.

The present invention provides a bonding pad that will prevent bond pad peeling or de-lamination during subsequent manufacturing process steps. In addition, the multi-layered dummy pattern located under bonding pad 350 allows for the creation of a structure that can alleviate stresses introduced during a wire bonding process. Thus, using the embodiments of the present invention, it is possible to form a robust bonding pad structure, simplify the manufacturing process, and reduce the manufacturing cost.

FIG. 6 illustrates a bonding pad structure according to a fourth embodiment of the present invention. In this embodiment, a tungsten plug 355 (or plugs) may have a rectangular-shaped, wedge-shape, or even solid cubic-shaped characteristics. The selection of a particular shape and or depth of a plug 355 is related to a design selection regarding the materials and complexity of the construction vs. the advantages obtained. Such advantages may relate to the reliability of the structure or some other electronic or mechanical performance parameter, such as current-carrying capability or mechanical flexibility.

Preferred embodiments of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A structure in a semiconductor integrated circuit having a plurality of electrical devices and a plurality of deposition layers, comprising:

a bonding pad having at least a first interconnection layer and a second interconnection layer integral to each other;

at least one peg integral with the bonding pad, the at least one peg vertically traversing one or more deposition layer of the semiconductor integrated circuit; and a raised dummy pattern integral with the at least one peg, the raised dummy pattern being a vertically stacked multi-layer dummy pattern including at least an interlayer dielectric layer, and electrode, and a capacitor structure, and having a height equsal to a height of a capacitor of the semiconductor integrated circuit, wherein the structure provides improved binding between the plurality of deposition layers as well as improved distribution of physical stress on the bonding pad.

2. The structure as claimed in claim 1, wherein the at least one peg is electrically conductive.

3. The structure as claimed in claim 1, wherein the at least one peg is made of metal.

4. The structure as claimed in claim 3, wherein the metal is selected from the group consisting of tungsten, aluminum, copper and nickel.

5. The structure as claimed in claim 1, wherein a plurality of pegs forming a mesh type pattern is integral with the bonding pad.

6. The structure as claimed in claim 1, wherein the raised dummy pattern is a raised adhesion layer made of a material selected from the group consisting of metals, metal nitrides, silicides, polysilicon and silicon nitride.

7. The structure as claimed in claim 1, wherein the height of the capacitor is between about 1 to about 3 microns.

* * * * *